United States Patent [19]

Riggs et al.

[11] 4,355,361
[45] Oct. 19, 1982

[54] DATA PROCESSOR APPARATUS FOR MULTITARIFF METER

[75] Inventors: Richard L. Riggs, East Point; Richard G. Coppola, Marietta, both of Ga.

[73] Assignee: Sangamo Weston, Inc., Norcross, Ga.

[21] Appl. No.: 119,071

[22] Filed: Feb. 6, 1980

[51] Int. Cl.$^3$ .............................................. G01R 11/57
[52] U.S. Cl. .................................. 364/464; 324/103 R; 364/483; 364/900
[58] Field of Search ............... 364/483, 464, 492, 493, 364/900; 324/103 R, 113; 235/92 EL, 92 CA

[56] References Cited

U.S. PATENT DOCUMENTS

| | | | |
|---|---|---|---|
| 4,050,020 | 9/1977 | Germer et al. | 364/483 |
| 4,059,747 | 11/1977 | Brody | 364/483 |
| 4,125,782 | 11/1978 | Pollnow, Jr. | 364/493 |
| 4,162,530 | 7/1979 | Kusui et al. | 364/464 |
| 4,179,654 | 12/1979 | Germer | 324/103 R |
| 4,197,582 | 4/1980 | Johnston et al. | 364/483 |
| 4,199,717 | 4/1980 | Germer et al. | 324/103 R |
| 4,283,772 | 8/1981 | Johnston | 364/900 |

FOREIGN PATENT DOCUMENTS 2046925  11/1980  United Kingdom .

Primary Examiner—Errol A. Krass
Attorney, Agent, or Firm—Dale Gaudier

[57] ABSTRACT

The meter includes a kilowatthour register which is continuously engaged as well as at least one special register (kilowatthour or demand) which is selectively engageable. A calendar memory (ROM) stores data representative of schedule events and the times (called "calendar times") at which such events are to be effected. The events may include the engagement of a special register or controlling a load under customer programming. A Central Processor Unit (CPU) deriving timing information from the line frequency generates real time data and compares it with the stored calendar time for implementation of a schedule event. When the schedule event time arrives, the CPU implements the event (as by energizing an appropriate register selection circuit) and addresses the next schedule event in the calendar memory. The system includes a display for the real time data as well as means for setting the time data. In the event of a power outage, a battery carryover is provided, in which case, the CPU generates the real time data from its crystal clock and causes the system to enter a power conservation mode in which the display is disabled and the special registers cannot be engaged. The CPU re-initializes itself with the next schedule event whenever the time is set, or the calendar memory is removed, or the real time clock "rolls over" at midnight, or when AC power is re-established following a power outage.

15 Claims, 12 Drawing Figures

```
UNIT=1    FILE=XASM    .LO

PSN=0405                         LSN=0000
00    4F 1E F0 4D 3C 28 78 A3          07 12 76 80 10 73 91 06     O..M<(X...V..S..
10    06 01 40 03 25 49 03 1C          72 86 C6 45 21 4C 6F 03     ..@.%I..R..E!LO.
20    43 1C 80 4A 12 85 7F 4F          3C EB 00 08 0D 0C 04 2C     C..J...O<......,
30    AB 0F 3E EB EA 02 00 21          0A 2C B7 0F F6 23 3C B5     ..>....!.,...#<.
40    3E 72 90 7A 89 48 19 E0          B5 3C 45 28 7E B4 68 B5     >R.Z.H...<E(..H.
50    78 9B 74 A0 7C A6 44 28          73 B4 8E 41 19 E4 49 B2     X.T...D(S..A..I.
60    46 19 E0 11 CB B5 42 19          E0 4C 21 74 B5 2B 21 78     F.....B..L!T.+!X
70    B5 4C 60 8E 03 0F 10 80          1E F0 1E F0 1E F0 15 80     .L@.............

PSN=0406                         LSN=0001
00    21 3D 29 86 13 B6 4A 13          D3 3F 71 AD 4F 3D 21 3C     !=)...J..?Q.O=!<
10    03 3D 4D 6A 1A C2 16 CD          20 4F 03 45 1B EA 4D 28     .=MJ.... O.E..M(
20    03 7E 94 4E 60 60 4A 3B          B2 39 B7 1F 8E 21 3D 29     ...N``J;.9...!=)
30    BD 8C 4E 6C 4A 37 A9 35          4E 28 20 6A AB 3C 1D 80     ..NlJ7.5N( j.<..
40    23 44 03 4A 1A 85 41 3E          21 3C 03 2C 87 0F 48 6F     #D.J..A>!<.,..HO
50    21 79 97 06 03 2C 68 49          21 74 A2 4B 23 44 2E 2C     !Y...,hI!T.K#D.,
60    9E 83 4C 23 41 2E 2C A5          41 2A A5 4F 9C 47 31 1F     ..L#A.,.A*.O.G1.
70    8E 35 47 32 AF 37 47 33          AF 26 BC 6F 19 BC 7F 7F     .5G2.7G3.&.o....

PSN=0407                         LSN=0002
00    49 03 38 8E 48 1A C5 2F          07 1A D6 2C 85 98 4C 1A     I.8.H../...,..L.
10    C5 2F 07 1A D6 2B 5A 8F          4D 3C 21 70 9F 77 A1 1A     ./...+Z.M<!P.W..
20    9F 10 97 3E 38 AE 45 21          7A AC 47 B3 4B B3 45 21     ...>8.E!Z.G.K.E!
30    78 AA 4F 23 4D 3C 2E 73          BD 18 26 B8 BE 2E B9 7F     X.O#M<.S..&.....
40    4B 83 45 3D 22 23 3F 4C          0D 03 25 8D 0C 2C 88 4C     K.E="#?L..%.,..L
50    2E 24 3D 0F 3C 21 0A 23          45 0C 0D 24 0F 2C 85 4F     .$=.<!.#E..$.,.O
60    3F 1E 26 80 1A 40 C5 16          CF 4F 3E 16 03 70 80 78     ?.&..@...O>..p.x
70    8B 1A 40 3D 21 3E 20 5D          B3 3D 21 3C 45 20 1E A0     ..@=!> ].=!<E ..

PSN=0408                         LSN=0003
00    1F C3 4D 1F C5 3C 43 1F          C5 EE 3E 13 B9 49 21 24     ..M..<C...>..I!$
10    02 0A 42 0C 08 0D 4D 22          0F 43 21 24 2C 90 90 3F     ..B...M".C!$,..?
20    4D 23 46 20 1E F0 08 7E          AA BC 3F 46 2A A3 49 0C     M#F ...~..?F*.I.
30    2C 5A AF 0F 4D 3C 60 41          23 45 1E B1 4D 3C 1C B9     ,Z..M<`A#E..M<..
40    4D 3C 2A 7A 9C 45 3E 19          E4 55 8C 9C 59 9E 4B 0C     M<*z.E>..U..Y.K.
50    2A 03 26 9C 4D 3C 39 9C          3B 9B 9C 6F 11 BB 11 80     *.&.M<9.;..o....
60    2F 3D 4D 03 1A C6 2F 0E          16 CF 20 23 53 A2 1F 8E     /=M.../... #S...
70    23 2C B1 07 B1 0F 19 BC          43 3C 1F C5 1F C3 11 BB     #,......C<......
```

LIST I

```
UNIT=1    FILE=XASM    .LO

PSN=0409                        LSN=0004
00     45 1E F0 41 19 E4 56 BB         46 19 E0 22 52 96 4A 21         E...A..V.F..."R.J!
10     26 A4 4B 3C 3B 98 0F BB         37 47 3A A2 4C 23 3E 46         &.K<;...7G:.L#>F
20     03 96 4A 9D 78 96 60 60         0F 18 C9 3E 42 19 E0 4C         ..J.X.``...>B..L
30     21 44 74 B7 21 19 8C 19         78 B9 80 49 12 A3 7F 7F         !Dt.!...x..I....
40     22 54 B9 42 22 59 B9 3C         47 38 B9 96 1A C6 2F 16         "T.B"Y.<G8..../.
50     CF 3E 42 22 02 B9 3E 18         F1 44 28 03 73 B9 68 48         .>B"..>..D(.s.hH
60     2F 05 A5 A6 2F 06 07 2E         0E 79 B7 2F 2E 2C 2E 0E         /.../....y./.,..
70     29 B7 2F 03 2C 0F B9 03         0F 1E B8 7F 4F 23 1F 8F         )./.,.......O#..

PSN=040A                        LSN=0005
00     41 3E 22 59 B3 4E 22 5A         BD 49 22 5A A7 45 21 78         A>"Y.N"Z.I"Z.E!x
10     92 99 4D 26 96 A7 2A 03         A7 3C 4B 31 0D 3E 43 25         ..M&..*..<K1.>C%
20     79 A7 4D 26 A7 49 0C 49         2A 3C 4B 70 B1 1D 39 BB         y.M&.I.I*<Kp..9.
30     B9 35 AD 52 A7 4E 22 58         BA 89 52 A7 89 54 A7 89         .5.R.N"X..R..T..
40     4B 30 39 85 A3 4D 26 89         A3 3E 49 26 A3 45 21 78         K09..M&..>I&.E!x
50     A3 43 21 45 29 A7 4F 3C         21 25 41 3F 03 25 A5 0C         .C!E).O<!%A?.%..
60     2C 5A 9C 1F 8E 0D A0 4F         3C 3B AE 49 0C 96 3E 4D         ,Z.....O<,.I..>M
70     26 96 43 21 4D 03 49 0D         96 38 A3 4F 3E 13 80 7F         &.C!M.I..8.O>...

PSN=040B                        LSN=0006
00     26 84 1F 8E 44 26 88 82         43 1A C5 48 23 16 CF 3E         &...D&..C..H#..>
10     43 03 40 3D 21 3E 29 99         A1 2E 29 9E 03 A1 20 59         C.@=!>)...)... Y
20     93 3F 03 23 0F 14 72 80         13 3D 47 3A B3 39 B0 B6         .?.#..r..=G:.9..
30     3C 31 B6 4B 3C 33 47 1B         80 16 44 26 9F 40 6E 9F         <1.K<3G...D&.@n.
40     3D 21 3C 2E 17 38 AA 3A         B2 3B B9 2E 3D 1B 49 69         =!<..8.:..;..=.Ii
50     62 6A 3C 47 3B 9A 3D 49         64 61 47 3C 39 AD 45 21         Bj<G,.=IDAG 9.E!
60     78 AD 76 BC B1 03 2C 28         B7 B7 2F 0E B5 F1 49 EA         x.v...,(.././...I.
70     EA 42 23 45 3D 25 A5 03         0F 49 EA EA 3D 4D 17 80         .B#E=%...I..=M..

PSN=040C                        LSN=0007
00     64 1A C0 16 D9 20 4B 1B         EA 4D 1B EA 72 81 47 60         D.... K..M..R.G@
10     44 21 73 A3 7B 98 47 30         44 60 21 40 03 42 21 48         D!s.{.G0D`!@.B!H
20     03 1F 8E 4C 1C 39 B1 3B         B5 AD 2E 38 B0 30 1B 8C         ...L.9.;...8.0..
30     34 AE 2E 3A B7 32 AE 36         AE 2E 3B BE 33 AE 37 AE         4..:.2.6..;.3.7..
40     7F 42 0D 3D 40 60 50 85         00 0F C4 3C C4 C4 2F 3F         .B.=@`P....<../?
50     4F 20 08 43 3C 03 4D 21         70 B3 43 38 B5 3A A6 24         O .C<.M!p.C8.:.$
60     5E B3 4D 6F 16 80 76 AD         7E A4 16 EE 2F 0E 4D 03         ^.Mo..v.~.../.M.
70     4B 3E 66 10 80 18 71 80         1F 73 AD 4E 0C 23 0E AD         K>f...q..s.N.#..
```

LIST II

DATA PROCESSOR APPARATUS FOR MULTITARIFF METER

BACKGROUND AND SUMMARY

The present invention relates to electric meters; and more particularly, it relates to an electric meter capable of recording the consumption of electric energy on one or more registers which are engaged only at certain times during the day. Such meters may be used, for example, to bill consumption of energy during peak use hours at a different rate than energy which is consumed during non-peak or "off" periods when demand is reduced. It is known that there are certain times during the day and certain periods during the week when electrical energy is in greater demand, and utilities must provide generating capacity in accordance with the maximum anticipated demand. By having different billing rates for different periods depending upon demand, the utility company can encourage the switching of loads to non-peak periods as well as apportion the cost of increased capital equipment to the customers whose demand has forced the increased capacity.

Multiple rate metering of electrical energy usage has been suggested as a means of setting proper billing rates. Some attempts have been specifically directed to applying dual rates with the higher rate being determined by a clock so that the rates are applied as a function of the time of day. Other attempts have been to measure the maximum usage by a particular customer during a predetermined interval (called "demand"), and then to apply a rate as a function of the maximum demand reading during a given billing period.

One system uses a programmed control circuit having a seven-day clock for performing the timing functions to engage and disengage drive gears for alternate rate decade-dial registers. This is disclosed in U.S. Pat. No. 4,050,020, granted Sept. 20, 1977.

The present invention is designed for use with a meter which includes a kilowatthour register which is continuously engaged as well as at least one special register which is selectively engageable. The special register may either be a kilowatthour (energy) or demand register. Further, two such registers may be used so that the combination of a selectively engageable energy meter and a selectively engageable demand meter may be used, or two selectively engageable energy meters may be used, one to record, for example, during periods of moderate demand, and the other to be used only during periods of peak demand.

A programmable memory (which may be Read Only Memory or ROM) stores calendar data representative of schedule events and the times (called "calendar" times, as distinguished from real time) at which such events are to be effected or implemented. A schedule event may be the engagement of a special register, or the controlling of a load under customer programming, or simply the illumination of an indicator light to let the customer know that a special rate is being applied or activating the display.

A data processor including a Central Processor Unit (CPU) derives timing information from the line frequency and generates real time data in a first file. The CPU compares real time data with calendar time from the ROM on a continuous basis. When real time equals calendar time, the CPU implements the event by energizing an appropriate register selection circuit or display circuit, or energizing an appropriate output lead, and addresses the next schedule event in the calendar memory. Preferably, the calendar times are stored in the calendar memory in chronological order so that the next calendar time is retrieved simply by incrementing an address register. This arrangement further facilitates the CPU's re-initializing (that is, synchronizing) the calendar ROM with real time, as will be described.

The system includes a visual display, preferably employing Light Emitting Diodes (LEDs), for displaying real time data when actuated by the operator. For this purpose, a Display Selection Switch and a Display Set Switch are also provided, accessible from the front of the meter. When the selection switch (referred to as S1) is actuated, the system enters a command display mode in which three separate time words are displayed, all representative of real time at which the system is set. Word I includes the minute and hour. Word II includes the day of the month and month. Word III includes the day of the week and the year (in two digits). Each time the Display Selection Switch is actuated, the CPU advances to the next word portion. If the Display Set Switch (S2) is depressed first, the system enters a mode of operation in which the real time data can be set. In this mode, switch S2 is used to select the data to be set from Words I, II or III and flashes that selected portion on the display. Switch S1 is then used to set that data by incrementing it.

As mentioned, the CPU derives timing data from an external timing source which, in turn, derives timing signals from the line source. A timing circuit receives the line frequency signal; and, by means of a count down circuit or counter, it counts the line frequency and generates an output pulse at a repetition rate of one per second. This timing signal as well as the output of the display switches mentioned above are coupled to the CPU through a multiplexer unit which is selected or addressed by the CPU itself. In addition to the use of a counter circuit to reduce the effect of line noise on internal timing functions, the program for the CPU takes approximately one second to complete. Program delays comprise 0.5 seconds, and this comprises a refractory time during which the CPU will not respond to timing interrupts. Hence, the effects of external noise signal on the timing of the CPU are reduced.

In the event of a power outage, the system switches over to a battery, and derives timing from the crystal clock for the CPU. Further, during battery carry over the visual display is disabled, and the system does not energize any of the special registers or the external signal lead.

The CPU stores real time data in a file in random access memory, and it also stores the time of the next event to be implemented, to be referred to as "calendar time". The program is designed such that if real time exceeds calendar time, the CPU will continue to increment the address in the calendar memory until calendar time exceeds real time. At a certain time every day (at midnight, for example) the CPU resets the contents of the calendar time file to zero. The program detects that real time is greater than calendar time and sequences through the calendar Read Only Memory (ROM) until it retrieves the next calendar event. Thus, the system re-initializes itself at least once a day.

Further, if the Display Set Switch is actuated even once, the CPU resets the contents of the calendar time file to zero so that re-initialization is automatically implemented. This also occurs if the calendar ROM is removed. That is to say, the calendar ROM has an output with a specific signal on it which is identified by the CPU. If that signal is not present the CPU senses this and resets the contents of the calendar time file to zero so that when a calendar ROM is then placed in the meter, re-initialization is automatic. This has the further advantage that a separate ROM, called an AUTOSET ROM may have a separate identification number other than "0" (for no ROM), or "1" (for calendar ROM), to identify the AUTOSET ROM. The AUTOSET ROM is used to automatically load real time into the CPU, and it does so by first clearing the real time and transferring the contents of the calendar time file into the real time file. This is done cyclically so that both the calendar time file and the real time file contain real time. When the AUTOSET ROM is removed, transients will not interfere because the last transfer of information will have been into the calendar time file, not the real file time file which will have been undisturbed. When a calendar ROM is then inserted, re-initialization is implemented so whatever was stored in the calendar time file will have been discarded anyway.

In a preferred embodiment, the calendar ROM contains data for up to six separate schedules permitting eight changes daily. The schedules in the exemplary embodiment include one schedule for weekdays, one for Saturdays, and one for Sundays/holidays. Further, a winter and a summer seasonal change are permitted. Events can be programmed on the quarter hour, and provision is also made for the beginning and end of daylight saving time. Demand intervals can be set to 15, 30 or 60 minutes, and the demand reset period can be set accordingly. A full four year calendar is provided in each calendar ROM.

Other features and advantages will be apparent to persons skilled in the art from the following detailed description of a preferred embodiment accompanied by the attached drawing wherein identical reference numerals will refer to like parts in the various views.

THE DRAWING

Figure 3:
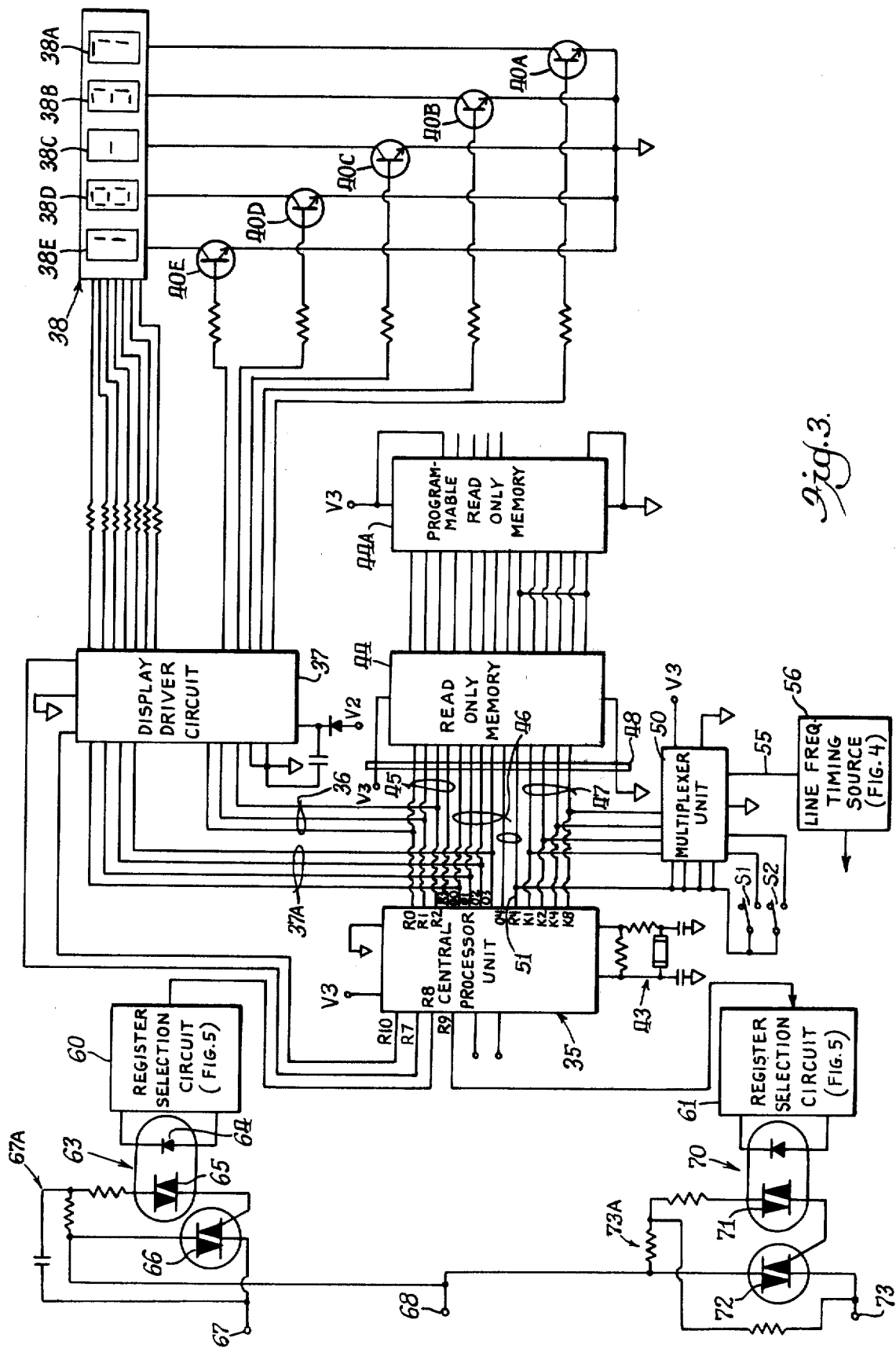
FIG. 3 is a more detailed circuit schematic diagram of the system of FIG. 1 with the major data processor elements in functional block form.
Figure 7A:
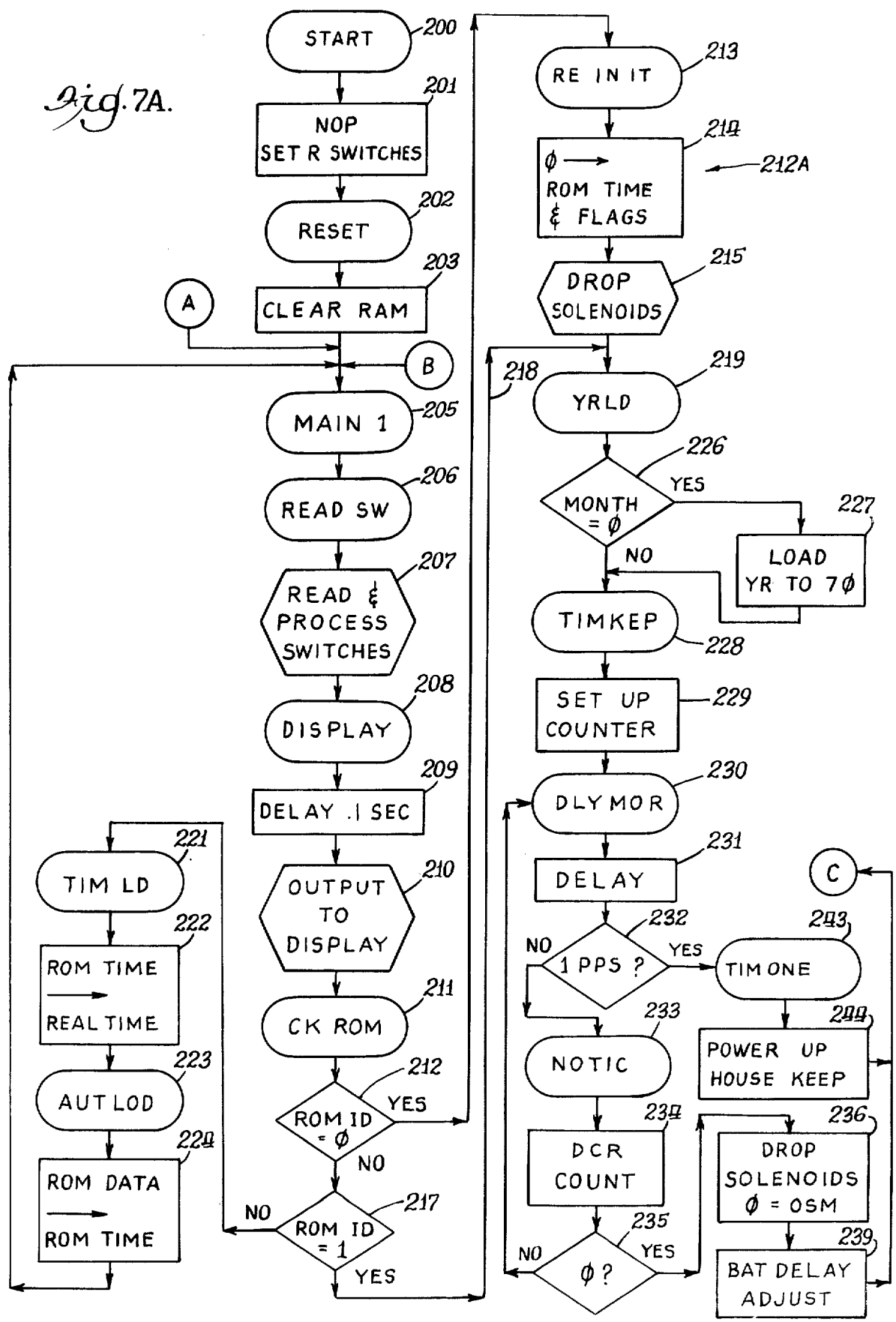
Figure 7B:
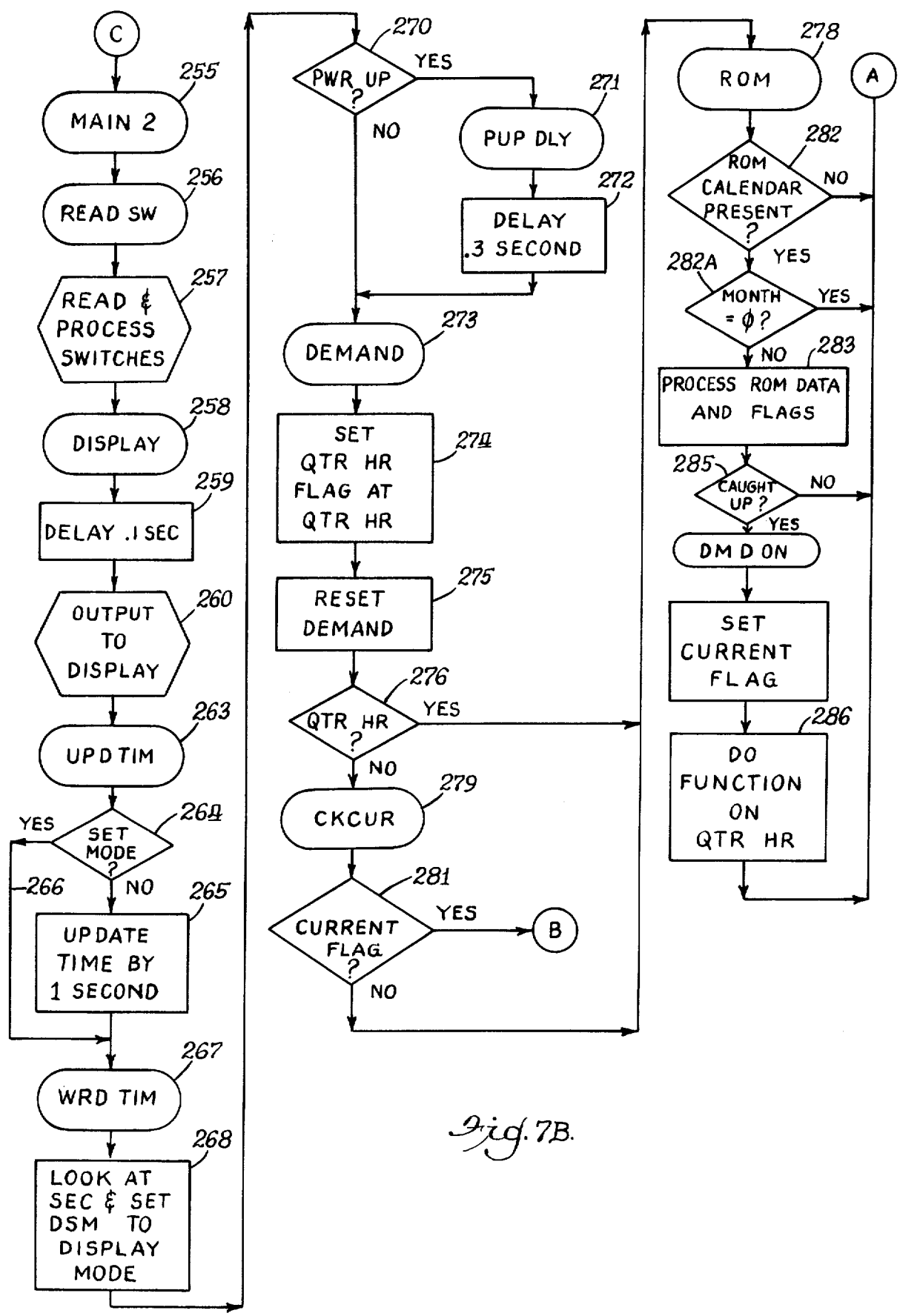

FIGS. 7A and 7B comprise a flow chart for the program of the Central Processor Unit for the system of FIG. 3.

Lists I and II comprise instruction code listing for the microprocessor.

DETAILED DESCRIPTION

Figure 1:
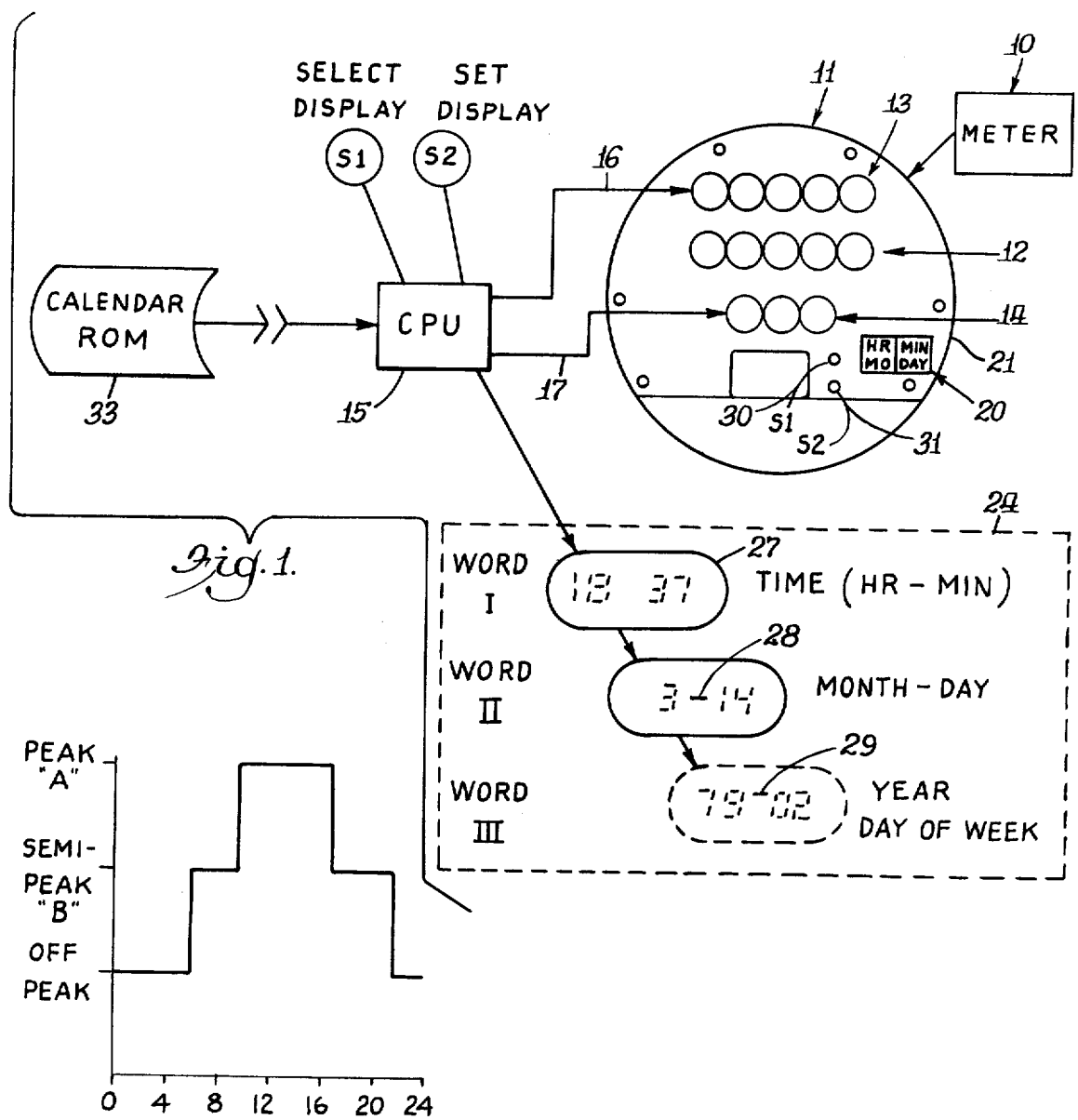
FIG. 1 is a functional block diagram of a system incorporating the present invention.

Referring first to FIG. 1, a general description will be given of the system of the present invention cooperating with an electric meter generally designated 10, which may be of conventional design. The meter 10 drives a register generally designated 11. Briefly, the register 11 has three decade dial registers, designated respectively 12, 13 and 14. The register 12 may measure toal kilowatthours. Hence, it measures energy, and is sometimes referred to as a "Total" register. The register 13 may be a "peak" register—that is, it is engaged only at selected times during the day, and it is intended that a higher rate will apply to the readings on this register. It also measures energy.

The register 14 may be a peak register, or it may be a demand register. If more than one peak rate is applicable, then the register 13 is referred to as peak "A" register, and register 14 is referred to as peak "B" register. If the register 14 is a demand register, it records maximum demand (that is, consumption of energy) during predetermined demand intervals, which may be 15 minutes, 30 minutes, or 60 minutes, according to rate schedules.

The switching mechanism for engaging each of the registers 13 and 14, whether a peak register or a demand register, is solenoid-actuated. Each of these registers is selectively engaged by a signal from a data processor including a Central Processing Unit (CPU) 15. A signal from the CPU along a line 16 causes the register 13 to be engaged, and a signal along line 17 causes the register 14 (whether it is a peak or a demand register) to be engaged.

A window or aperture 20 is formed in the dial plate 21 on which the registers 12-14 are located. The meter contains a printed circuit board behind the dial plate 21 on which a digital display is mounted, using Light Emitting Diodes (LEDS), diagrammatically illustrated within the dashed line 24. A tubular element called a light tunnel couples the display to the window 20 at the front of the meter. In the illustrated embodiment, the display is a five-digit display used to display time. For this purpose, the display data is broken down into three words. As will be described, the display may be a five-digit numerical display. Word I, as diagrammatically illustrated in FIG. 1 displays the hour and minute; it is signified by blanking the center digit (see 27). Word II displays the month and day; it is signified by illuminating the middle horizontal segment of the seven-segment center digit (see 28). Word III displays the year and the day of the week; it is signified by illuminating the upper horizontal segment of the center digit (see 29).

The Words I, II and III are displayed in that order by sequential actuations of a Command Display Switch S1 which communicates with the CPU 15 and causes it to operate in a Command Display Mode, as will be described. The actuator for the switch S1 is the button 30 in the lower right hand portion of the dial plate 21.

If a switch S2 is actuated first by means of actuator 31 on dial plate 21, the CPU causes the system to enter a Set Display Mode. This mode of operation will also be described in more detail below, but briefly, sequential actuations of switch S2 selects which data of Words I, II or III will be set. The corresponding selected data will be flashed on the display so the operator knows which data is being set. The data that is thus selected is then incremented or "set" by sequentially depressing switch S1 (or by leaving it depressed, in which case the CPU increments the selected data).

The CPU 15 stores the real time information which is displayed on the display 24 in the internal memory which is a random access memory (RAM).

A principal function of the CPU 15 is to engage and disengage the registers 13 and 14 in accordance with a predetermined schedule. The schedule data, including a list of holidays, (up to 12 holidays a year), daily schedules (up to six, each permitting up to eight changes), dates for beginning and end of Daylight Savings Time, and dates for beginning winter and summer schedules are stored in a Read Only Memory (ROM) 33, sometimes referred to as the "calendar memory".

The ROM 33 also stores data defining the duration of the demand interval, if any. This may be either 15, 30 or 60 minutes. It also stores the demand reset interval—that is, the time between demand intervals required to reset the demand register. During the reset period, the demand drive train is disengaged by the meter mechanism.

Figures 2A, 2B, 2C:
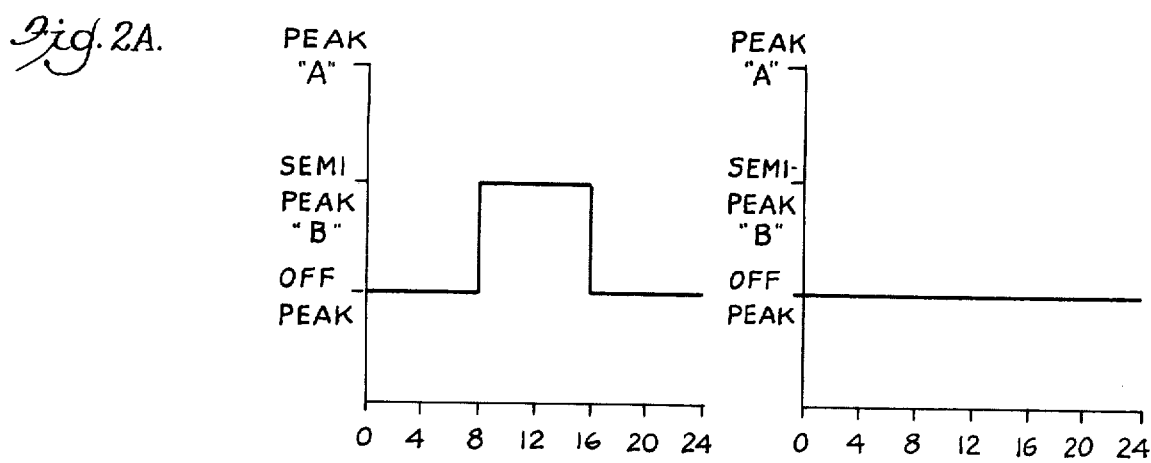
FIGS. 2A-2C are graphs illustrating three typical daily schedules that can be applied in the system of FIG. 1.

Referring now to FIGS. 2A–2C, there are shown examples of a daily rate schedule, a Saturday rate schedule and a Sunday/holiday rate schedule respectively, for a meter having two "peak" registers, such as those designated 13 and 14 in FIG. 1.

Referring first to FIG. 2A, during "off peak" hours (namely, 9:00 P.M. to 6:00 A.M.), only the total register 12 is engaged (this register is continuously engaged as indicated above). During semi-peak hours, the peak B register 14 is engaged by the CPU 15, and during peak hours (approximately 10:00 A.M. to 5:00 P.M.), the peak "A" register 13 is engaged, but the peak "B" register 14 is disengaged.

Referring to FIG. 2B, on Saturday, the semi-peak register is engaged for a period corresponding to the peak hours on a week day. On a Sunday or a holiday, no meter peak register is engaged.

Turning now to the more detailed circuit schematic of FIG. 3, reference numeral 35 generally designates a Central Processor Unit (CPU) which may be an MC141000 microprocessor, manufactured by Motorola Semiconductor Products Inc. of Austin, Tex. The outputs of the CPU designated R0, R1 and R2 comprise an address bus generally designated 36 for a display driver circuit 37. Outputs 00-03 of the CPU comprise a data bus 37A which is coupled to the data inputs of the display driver circuit 37. The address lines are used to address one of five digital diaplay circuits 38A–38E of a digital display unit generally designated 38. The display driver circuit 37 may be part No. MM74C912N, manufactured by National Semiconductor Corporation. The display unit 38 is a conventional five-digit LED display with each digit comprising a seven-segment display (all seven segments being energized in the illustrated embodiment for digit 38D).

The digit display driver 37 stores the display data in internal registers. One such register is provided for each digit, and the registers are addressed via the address bus 36. The driver circuit 37 also transmits signals to digit select transistors 40A–40E, each transistor being associated with a digit location is the display for energizing the selected digit.

Returning now to the CPU 15, it derives internal timing from a crystal generally designated 43, in a conventional manner. In addition to the lines R0–R2 forming the address bus to the display driver circuit 37, an address bus comprising buses 45, 46 and chip select lead 51 are used to address a read only memory 44 (ROM). A data bus 47 communicates the CPU 35 with the read only memory 44 and a multiplexer unit 50. The data bus is connected to the ROM inputs by means of a connector diagrammatically illustrated at 48. Thus, the ROM can be conveniently replaced, as will be further discussed below.

The ROM 44, as indicated above, may be changed simply by disconnecting its leads and buses using connection 48. In the case where a utility would use a large number of the systems described herein, the memory 44 may be a mask-programmable Read Only Memory. Where quantities would not justify the use of such techniques, a PROM of the type which is factory programmed as diagrammatically illustrated at 44A may be used. The latter type of ROM is available through Intersil under designation IM6654. If no ROM is connected, then the CPU senses a "0" logic level on all 4 data leads designated 47. If a calendar ROM is present (either a PROM or ROM of the type described), then a signal on one of these leads to initiate a BCD value of 1 is present. As will be further described below, the system is also capable of being automatically set by a special ROM, in which case the CPU recognizes this ROM by any hexidecimal code 2 through F on the data bus 47; and when it does so, it enters into an AUTOSET mode for loading real time into the CPU, to be described. All ROMs are, of course, compatible with the circuit.

A Multiplexer Unit 50 (which may be part No. MC14016CL of Motorola) has its outputs connected to the four lines comprising input data bus 47 to the CPU. The CPU 35 selects either the ROM 44 or the Multiplexer Unit 50 by means of a Chip Select signal on control line 51 (FIG. 3). If this signal is a logic 0, ROM 44 is selected, so that its outputs communicate with the CPU along the data bus 47. The output gates of the ROM 44 are tri-state gates, that is, they can generate either logic 1's, or 0's, or, if the signal on lead 51 is a logic 1, the output gates present an open circuit to the bus 47. Thus, a logic 1 is used to select the Multiplexer Unit 50.

The Multiplexer Unit 50 has three active inputs, the fourth being grounded. These inputs are received respectively from the Display Select Switch S1, the Display Set Switch S2, and an external timing signal on line 55 received from a line frequency timing source 56, shown in FIG. 4 and to be described in more detail below.

Briefly, the signal on line 55 has a repetition rate of one pulse per second; and it is used to update the real time clock in the CPU 35.

Turning now to the outputs from the CPU as indicated on the left-side of block 35, beginning at the top, output R10 enables the Display Driver 37 to receive output data from the CPU along data bus 37A. Output R7 of the CPU blanks and unblanks the Display Driver Circuit 37. Outputs R8 and R9 are control outputs to Register Selection Circuits 60, 61 (seen in more detail in FIG. 5, as will be explained presently), and output R6 is a separate control output which may be energized as programmed by the customer.

In the case where Register Selection Circuit 61 is used to engage a demand register rather than a kilowatt-hour register, the signal on output lead R9 must de-energize the Register Selection Circuit for the demand reset interval, as determined by the contents of the ROM 44. The demand reset interval, as indicated above, depends upon the demand period, and it enables the mechanism to reset the demand register at the end of a demand interval.

The output of the Register Selection Circuit 60 is fed to a photo-isolation circuit generally designated 63 and including a photo-emitting diode 64 and a photo-responsive diac 65 which is connected in the gate circuit of a triac 66, the output of which is designated 67. Power is fed to the $T_o$ terminal of triac 66 from input lead 68, and coupled to output terminal 67 when the triac 66 conducts. This signal may be used for load control purposes, if desired.

Similarly, the output of Register Selection Circuit 61 is connected to a photo-isolation circuit 70 which includes a photo-responsive diac 71 connected in the gate circuit of a triac 72. The triac 72 is connected between the power input terminal 68 and a second output terminal 73. It will be observed that the Register Selection Circuits 60, 61 energize their associated register selection solenoids independently of the output circuits just described. These output circuits, in other words, may be used for customer purposes such as load programming, illuminating indicator lamps or the like.

Figure 4:
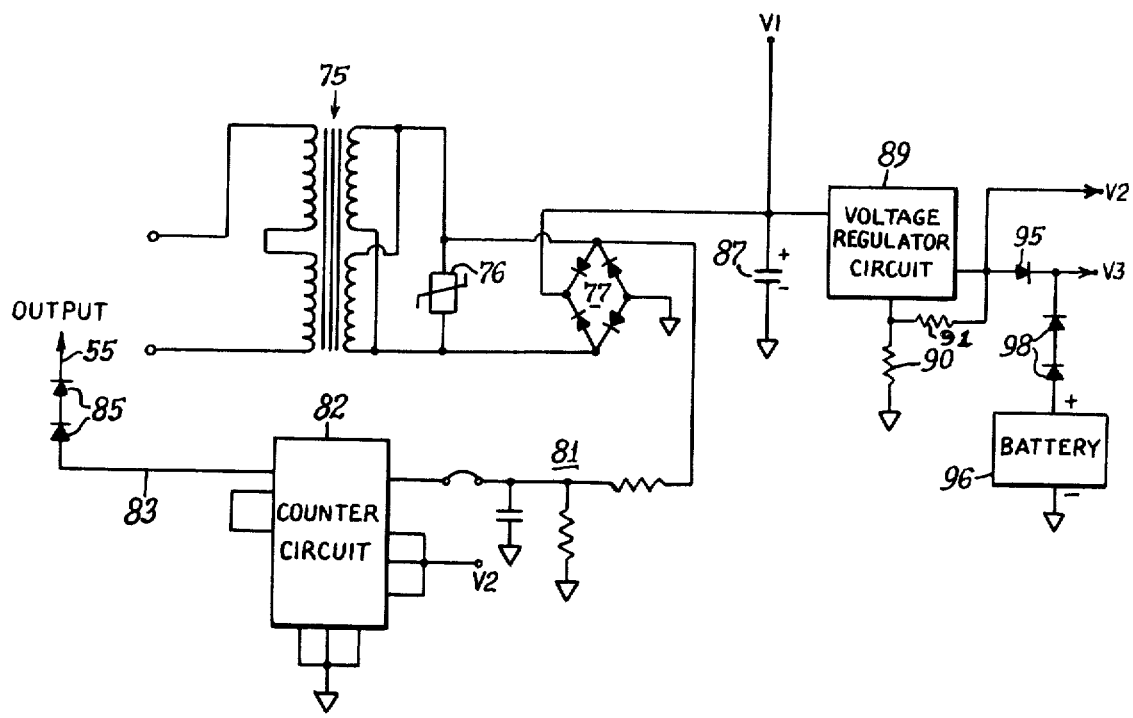
FIG. 4 is a circuit schematic diagram, partly in functional block form, of the supply voltage and line frequency timing source circuits of FIG. 3.

Capacitor and resistor combinations 67A and 73A are well known snubber networks which prevent current spikes when switching inductive loads Turning now to FIG. 4, there is shown the circuitry for deriving the various voltages used in the system and the external timing signal from the line frequency. Incoming line frequency power is connected to the primary of a transformer generally designated 75. A varistor 76 is connected across the secondary of the transformer 75. A first full wave rectifier bridge 77 is also connected across the secondary of the transformer 75, the output of which is a voltage designated V1. The secondary of transformer 75 is also connected to a filter circuit generally designated 81, the output of which is connected to a counter 82. The counter 82 divides the repetition rate of the incoming signal (60 Hz.) by a factor of 60, and therefore generates an output signal on line 83 having a repetition rate of one pulse per second. This pulse is fed through series-connected diodes 85 to the line 55 which feeds one input of the multiplexer 50 of FIG. 2. Thus, the basic external line frequency has a repetition rate of one pulse per second.

The output of the rectifier bridge 77 is connected to a filter capacitor 87 and to the input of a voltage regulator circuit 89. Resistors 90 and 91 are connected to the regulator 89 to increase its output voltage slightly. The output of the regulator is used to derive voltage V2. The output of the regulator 89 is also coupled via diode 95 to generate a voltage designated V3. A battery 96 having two diodes 98 connected in series with it is also connected to the cathode of diode 95 to provide carryover power in the event of an outage. Diode 95 isolates V2 from V3 in the event of a power outage so that the display is shut down but the microprocessor is not—see FIG. 3. This conserves battery power during an outage.

To summarize the voltages just described, voltage V1 is used as a supply voltage for the solenoid driver (to be discussed in connection with FIG. 5). Voltage V2 is the normal supply voltage for the integrated circuits and other circuitry described above. However, should there be a power failure, voltage V3 would become the battery carryover voltage, and the terminal of V2 would be isolated by diode 95. Voltage V3 supplies power to the Multiplexer Unit 50, the CPU and the ROM 44, but it is not coupled to the display circuitry. The reason for this is that during an outage, an attempt is made to conserve available power for only those elements which are considered essential. Further, during battery carryover when primary power is out, the special registers are not engaged. By thus conserving available power during a power outage, the system can operate for a minimum of thirty-five days, using the crystal oscillator for the CPU 35 as the basic timing signal during such outage period.

The normal supply voltage for the processor circuitry, V3, is set, by the voltage regulator circuit 89 and Resisters 90 and 91, to be above the terminal voltage of the battery 96 so that the battery is not depleted during normal power availability.

Figure 5:
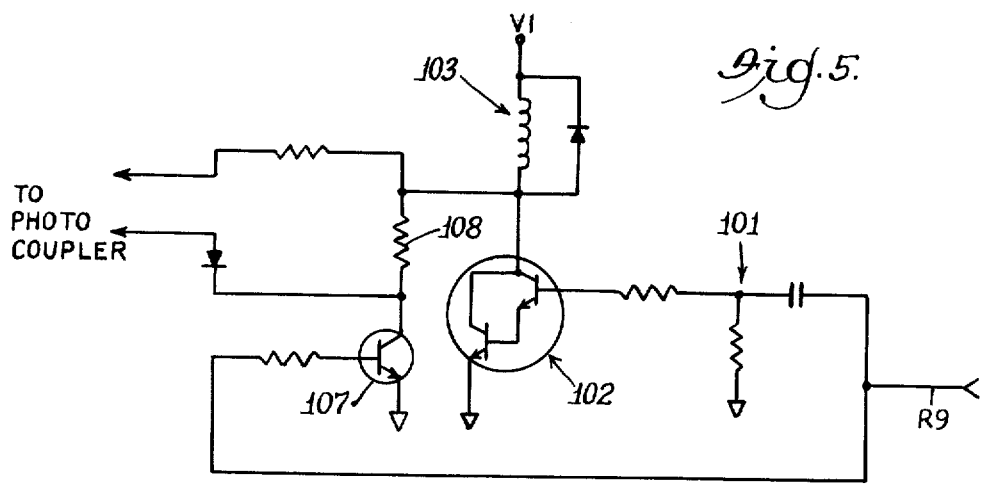
FIG. 5 is a circuit schematic diagram of a register selection circuit of FIG. 3.

Turning now to FIG. 5, as indicated above, the CPU 35 generates a signal on outputs R8 or R9 respectively to actuate either Register Selection Circuit 60 or 61 for engaging a selected register. A Register Selection Circuit is shown in FIG. 5. The incoming signal is differentiated in the differentiator circuit 101, and fed to a Darlington transistor pair 102, having in its collector circuit a winding 103 of a solenoid which actuates the register engagement mechanism.

The signal fed through the differentiator 101 which causes the transistor pair 102 to conduct provides an initial actuating current for the solenoid, and a holding current is provided by a transistor 107, having its base connected to the input line R9. Thus, the larger initial current is provided by the transistor pair 102, and a smaller, holding current is provided by the transistor 107 which has a limiting resistor 108 connected in its collector circuit which is inserted in series with the winding 103 when the transistor pair 102 becomes non-conducting (due to the blocking of the capacitor in the differentiator 101). Further, the voltage developed across resistor 108 becomes the output voltage to the optical isolator generally designated 70 in FIG. 2 for illuminating an indicator lamp or generating a load control signal as described above.

If the register associated with the actuating solenoid 103 is a demand register, as distinguished from an energy and/or "peak" register, the demand period (whether fifteen, thirty or sixty minutes) is defined in the ROM, and sensed by the CPU which disables the signal on line R9 to the register selection circuit during the reset period at the end of each demand interval. This disengages the solenoid 103 and permits a weighted gear to reset the demand register. In the case of a cumulative demand register, the contents of the demand interval register are transferred at this time to the cumulative demand register. In addition to defining the demand interval, the ROM defines the reset period which is a function of the demand interval. That is, the longer the demand interval, the longer is the reset period during which the signal on line R9 is periodically disabled.

Detailed Flow Chart

Turning now to the flow chart of FIG. 7A, reference numeral 200 designates the start of the program. In block 201, the CPU 35 generates an output on control line 51 to select the Multiplexer Unit 50 thereby isolating the ROM 44 from the data bus 47. Next, the CPU implements a subroutine identified by block 202 to clear its RAM, as indicated in block 203.

With the RAM cleared, the program enters the Main 1 portion of the program, indicated in block 205. Next, a subroutine READSW, indicated by block 206, is executed for reading and processing the data from the switches S1, S2, as indicated by the subroutine 207.

Figure 6:
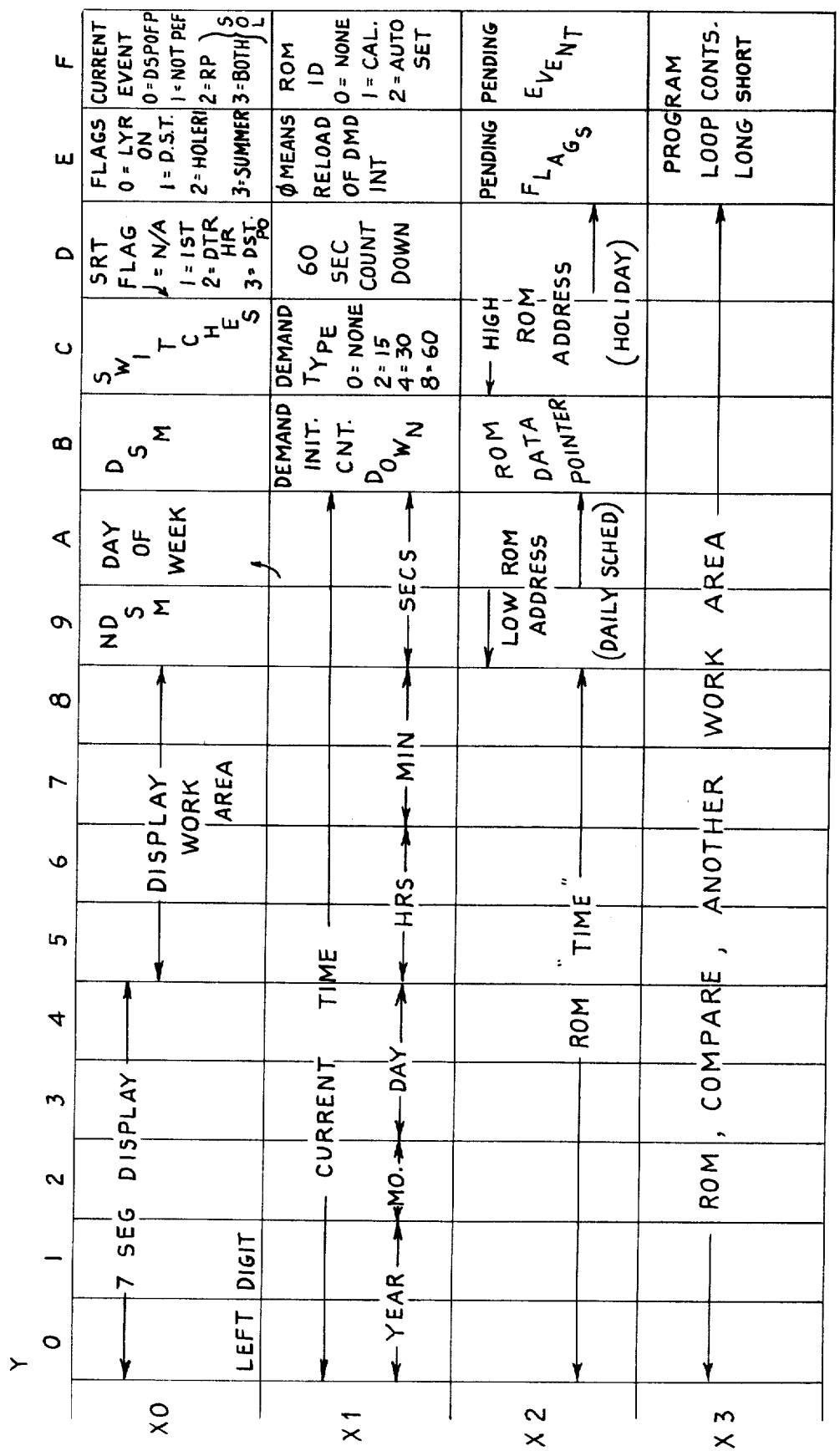
FIG. 6 is a map of the Random Access Memory in the Central Processor Unit of the system of FIG. 3.

Referring momentarily to FIG. 6, which is a map of random access memory, in the CPU 35. It includes four files as diagrammatically represented by the horizontal rows X0–X3. Each file includes sixteen words, identified as 0–9 and A–F along the top of the map. The status of the switches S1, S2 is stored in file X0, word C. The cycle time of the program is fast enough so that each actuation of either switch S1, S2 will be sensed by the CPU to change the status of the switches in this memory location. Hence, the RAM stores data representative of the status of the switches which is used to sequence the words displayed on the LED display 38 (switch S1) in the Display Mode and to set the portions of the words (using switch S2) in the Set Mode.

The program then executes a subroutine indicated by block 208, DISPLY, for displaying data which is outputted from the CPU to the Display Driver Circuit 37.

File X0, Word B (or simply, word 0,B) labeled DSM (Display/Set Mode) appears on the memory map of FIG. 6. The meaning of the coded contents of DSM are indicated in Table I. The contents comprise a four-bit word, yielding sixteen possible combinations indicated by the left column, and the right column indicates the corresponding meaning of the word. The last three states may be referred to as a "normal" mode. It is used for alternately displaying Word I, Word 2 and blank (display is not energized) under CPU control (i.e., without external intervention). Words 9, A and B, comprise the previously mentioned Command Display Mode.

and blanks the display. This is one primary mode of switch operation, namely the Command Display Mode.

The second mode of switch operation is the Set Mode. Assuming the system is operating in one of the normal display modes—words D, E or F of Table I, the first actuation of switch S2 enters the value "1" into the DSM—namely, "Set Minutes". Each subsequent actuation of switch S2 will increment the contents of the DSM once, up to a value of 6—"Set Year". The seventh actuation will bring the contents to the value of F which is the blank normal display mode.

The first actuation of switch S2 in the Set Mode will cause the Word I to be displayed—namely, minutes and hours, and it will flash the "minutes" contents. The minutes may then be incremented by sequential depression of switch S1. The second depression of S2 will still display Word I, but it will cause the contents of the "hours" location to be flashed, and permit the value of the hours to be incremented by depressing the S1 switch.

The switches S1 and S2 do not have to be depressed

TABLE I

|  |  | CODE | FUNCTION - DSM |
|---|---|---|---|
|  |  | 0 | — A.C. Power Off; Display All Blanks |
|  | WORD I | 1 | — Set Minutes |
|  |  | 2 | — Set Hours |
| SET MODE | WORD II | 3 | — Set Day of Month |
|  |  | 4 | — Set Month |
|  | WORD III | 5 | — Set Day of Week |
|  |  | 6 | — Set Year |
|  |  | 7 | — Not Used |
|  |  | 8 | — Not Used |
| COMMAND DISPLAY MODE |  | 9 | — Command Display Word I |
|  |  | A | — Command Display Word II |
|  |  | B | — Command Display Word III |
|  |  | C | — Not Used |
| NORMAL MODE |  | D | — Normal Display Time - Word I |
|  |  | E | — Normal Display Time - Word II |
|  |  | F | — Normal Display Time - Blanks |

Operating on one of the Command Display Modes is effected by actuating switch S1 first. The number 9 is loaded into the DSM, word 0,B, and the number 6 is loaded into the 60 second countdown register, word 1,D to provide approximately 60 seconds of display. This is accomplished in the program, in the block 207 entitled "Read and Process Switches". There is an identical block designated 257 on FIG. 7B. The output to display block 210 (as well as the block 260 of FIG. 7B) takes the contents of DSM and determines which information to transmit to the display based on the data contents of DSM.

When the contents of the 60 second countdown register are decremented to zero, the program looks at the contents of the DSM and if the system had been calling for a COMMAND DISPLAY mode (words 9, A, or B) then it is incremented to a normal display mode. If the operator presses switch S1 within the 60 second interval, the contents of the tens position of the 60 second countdown circuit are reset to 6, and the contents of the DSM are incremented by 1, namely, rendering a value of A—COMMAND DISPLAY WORD 2. Similarly, COMMAND DISPLAY WORD 3 (year and day of week) will be displayed for approximately 60 seconds when S1 is actuated within the new 60 second interval. If during that interval the switch S1 is depressed a fourth time, the system enters normal display mode F in a separate motion in order to increment the contents of DSM. Rather, if it is left depressed, the program will automatically increment the contents of DSM at an interval of approximately 0.5 seconds.

The time base for flashing the contents of a register as well as for setting the contents of a selected register is determined by the fact that it takes approximately one full second to complete by cycle through the program; however, the "Read and Process Switches" subroutine is located in the program at two places—namely, blocks 207 and 257. In other words, the READSW and DISPLAY subroutines are called upon two times a second to provide the required functions. Flashing is accomplished each half cycle. The program first displays the complete word each half cycle (specifically, each time subrouting READSW is implemented), as indicated in blocks 207 and 257. Then, the program determines whether the switches S1, S2 are being operated in a SET mode. If they are, as soon as the program determines from the contents of the DSM which half word is being set, depending on the contents of DSM, it then deenergizes the display for that portion of the word, thereby causing the flashing.

The next portion of the program is a subroutine identified as CKROM, represented by block 211. In this portion of the program, the CPU identifies the type of ROM that is connected by means of the connector 48.

In decision block 212, if the identification of the ROM is 0 (actually an open circuit), it indicates that no ROM is present, and the program proceeds along path 212A to subroutine REINIT indicated in block 213. In this subroutine, the RAM of the CPU has to be reinitialized because information stored in the RAM representative of the next holiday and of the date and time of the next "control event" has to be cleared. A "control event" is any event requiring action by the CPU, such as a schedule change, a demand reset period, or the like. Thus, in block 214, the "ROM time" stored in register X2, words 0–8 of the RAM (FIG. 6) are set to zero, the pending flags (word E of register X2) and all other flags are also set to zero at this time. Further, in block 215, any solenoids that may be energized are de-energized.

If, in decision block 212, the CPU had determined that the ROM identification number is not 0, this indicates that a ROM is present. However, it may be a calender ROM, or a ROM used to automatically set the timing of the system, sometimes referred to as a "calibration ROM". If the identification of the ROM is a 1, as determined in decision block 217, it is taken as an indication that a calender ROM is present, and the program proceeds along path 218 to a subroutine 219 labeled YRLD, which is used to load the current year (actually the value "70") into the RAM, to reduce the amount of time to set the current year in the event of a battery depletion during a power outage, for example.

If, in decision block 217, it is determined that a ROM is present, but it is not a calender ROM, the program proceeds to subroutine TIMLD, identified in block 221. The contents of the first nine words of file X2 of the Random Access Memory (see FIG. 6) are transferred to file X1—namely, the portion of file X1 referred to as "current time" or real time. Next, in the subroutine labeled AUTLOD, block 223, the program enters the data from the ROM into file X2 thereby filling words 0 through A. This is the "ROM time" of calendar time indicating the time for the next scheduled event, as well as the ROM address identifying the daily schedule being implemented. This is indicated in block 224.

To summarize the operation of the program just described, the first time the program cycles through block 217 and determines that an AUTOLOAD ROM is present, it transfers the contents of ROM time to current or real time in file X1. The first time this happens, it is of little significance because meaningless information had been present in file X2. However, as the program continues to cycle, eventually the data from the ROM will be entered into file X2 and then into file X1. The information stored in file X1 is therefore more reliable because any transients that may be generated when the AUTOSET ROM is removed will be stored in file X2, not the real time file.

After the AUTOSET ROM is removed, the program identifies that no ROM is present in block 212, and sets the contents of ROM time in file X2 to zeros (see block 214, described above). Thereafter, when a calender ROM is inserted, the CPU re-initializes itself (as will be discussed in more detail). The contents of file X2 will be the calender time for the next schedule event, and current time will have been loaded into the real time file X1. In the interim, of course, the CPU continues to increment the real time file either from the line frequency timing source 56 or, in the case of a power outage, the crystal clock 43. This process insures that any transients caused by inserting or removing the AUTOSET ROM will not effect the contents of the real time file in X1, as just described. It will also be observed that in the AUTOLOAD mode, after transferring the contents of ROM time to current time, the current loops back to MAIN 1, block 205. After exit from the AUTOLOAD mode, the program will eventually proceed to block 219.

In the subroutine YRLD, the program first determines whether the contents of the month (word 2, File X1 of the random access memory) is 0, as indicated in block 226. If the month is 0, it indicates that real time has not been set, and some predetermined year is loaded into words 0–1 of File X1, such as "70" (for 1970) to facilitate counting to the current year. This is indicated in block 227.

The program then proceeds to process block 228 which is a subroutine labeled TIMKEP. In this subroutine, the program attempts to determine whether an external timing signal is present, and if not, the CPU (without taking this necessarily as a power outage) enters an energy conservation mode, relying on the crystal oscillator for timing. In block 229, a predetermined number is entered into a counter. The number that is entered depends upon the period of the timing signal expected to be received from the external source, the amount of time it takes the program to complete a full loop, and the number of timing signals that are permitted to be missed before entering the energy conservation mode. Each time the program completes a cycle, it decrements the counter that is set up in block 229.

After setting up the counter, the program proceeds to subroutine DLYMOR indicated in block 230 in which a program delay is implemented in block 231. This is a program delay to set the cycle time of the program. In block 232, the CPU determines whether a timing signal is present from the multiplexer unit 50 on data bus line R8 (FIG. 2). If it is not, a subroutine NOTIC is entered in block 233 in which the counter (discussed in connection with block 229) is decremented in block 234. Next, in decision block 235, the program determines whether the counter is decremented to 0. Eventually, if the external timing signal is not detected in block 232, the counter will be decremented to 0 in which case the program disengages any solenoids that may have been engaged and disables the Display Circuit 37 and digital display unit 38, as indicated in block 236. In block 239, a program delay is implemented so that the program cycle time is the same as when line power was supplied.

If, in block 232, an external timing pulse (one pulse per second) is detected, the program enters into a subroutine TIMONE identified in block 243 in which flags are set indicating the external power is available and solenoids may be re-engaged if they have been disengaged. Otherwise, operation continues, and the current time file is incremented every second, this being indicated in block 244. Exiting from either block 239 or 244, the program proceeds to the MAIN 2 portion of the program as indicated in block 255 of FIG. 7B.

To summarize the operation of the system just described, program execution timing is derived from an external source. Briefly, it consists of a positive level lasting for approximately thirty percent of a 60 Hz. cycle. The program, in trying to synchronize itself to the leading edge of the timing pulse, ordinarily will be shorter than the period of the external timing pulse by a short period of time, or "window" during which it tries to detect the external timing pulse. If the pulse is received as expected, the program exits block 232 in the "yes" exit into block 243 to commence power up housekeeping in 244 and then re-enters the main loop at connector C.

If, on the other hand, the external timing source is not present, the "window" is extended as defined by the contents of a counter set up in block 229. Each time the subroutine passes through block 234, this counter is decremented. Finally, when the contents of the counter is decremented to 0, as detected in decision block 235, the program proceeds to block 236 where the solenoids are de-energized (thereby entering a power conservation mode), and the contents of the DSM are set to 0. The program then effects a fine time adjustment in block 239 to adjust the main loop timing to exactly one second, thereby establishing the internal timing required for effecting one program cycle to be one second.

At the same time, the program is shortened by deleting the operations normally performed in blocks 271 and 272. This increases the "window" during which the program is looking for a signal from the external timing source. This is effected in block 270 by determining whether the contents of the DSM have been set to 0. If the contents have been set to 0 as indicated in block 236, then the program proceeds from decision block 270 to block 273. If power is up, the contents of the DSM have not been set to 0; and a program delay of 0.3 seconds is implemented in block 272. That is, the "window" during which the program looks for a signal from the external timing source is decreased by 0.3 seconds.

When the program eneters MAIN 2, it executes the subroutine READSW, as indicated in block 256. This subroutine is the same as discussed in connection with block 206 and the following blocks 207-210, which correspond repectively to blocks 257-260 in MAIN 2. In brief, it reads the switches S1 and S2, and controls the digital display accordingly. The display is updated every one-half second since the program cycle time is approximately one second.

After enabling the display, the program executes subroutine UPDTIM to update the contents of the current time file, as indicated in block 263. However, before incrementing current time, the program decides in block 264 whether it is in a SET Mode, discussed above. If it is, the program does not increment the current time registers, but follows path 266. If the program is not in such a mode, it updates the current time in File X1 in the block 265 by incrementing the seconds count of Words 9 and A.

If the program is determined to be operating in a set mode in block 264 or, if appropriate, the current time has been incremented, the program proceeds to subroutine 267 WRDTIM to provide for incrementing minutes, hours, day, month and year in the current time file, as required.

The program then proceeds, in block 268, to execute the normal display modes as follows: (a) display Word I for six seconds; (b) display Word II for six seconds; and (c) blank the display for eight seconds. To do this, the program sets the display mode and actuates the appropriate display logic.

The program then determines whether line power is available in block 270. If it is available, the program proceeds to a delay mode in block 271. If the display is actuated, a symmetrical duty cycle for displaying and blanking cycles (twice a second, one-half seconds each) is achieved by a program delay of 0.3 seconds in block 272.

After the delay of block 272 (or alternatively a determination that line power is not available in block 270), the program proceeds to a subroutine 273 called DEMAND, in which it is determined whether a demand register is being used. If so, the program sets a flag called the "quarter hour flag" in block 274 at a time slightly before the quarter hour. If the customer schedule being implemented requires resetting the demand register, a demand reset interval is implemented in block 275, and the demand interval is reset. This is done, as indicated above, by de-energizing the associated Registered Selection Circuit for a predetermined time, depending upon the length of the demand interval, to enable the register to be reset under gravity.

If the program determines that a quarter hour is imminent in block 276, it proceeds to a subroutine called ROM, as indicated in block 278. If a quarter hour is not imminent, the program proceeds to a subroutine in block 279 CKCUR in which it is determined in block 281 whether a "current flag" is set. This, as will be discussed presently, is an indication of whether or not the program is in the right place in the schedule in the ROM and whether it is aware of the next upcoming holiday, for example. If the current flag is set, the program proceeds via connector B to the MAIN 1 portion of the program in FIG. 7A.

In various places there are mentioned "pending" and "current" events. Pending event information is stored in file X2, words E and F; whereas current event information is stored in the corresponding words in file X0. A "current" event is the one currently being implemented, and a pending event is the next event to be implemented. Referring to block 281, for example, the word "current" is used in a different sense—namely, there, reference is being made as to whether in relation to the current time, the contents of the pending event memory locations accurately identify the next event to be implemented. The function of the block 281 is to reduce variable program time by limiting a comparison time to ROM time only to those times immediately preceding a quarter hour (which is the only time an event or function can be implemented). The variable time is caused by the subroutine which compares current time in file X1 with ROM time in file X2, the variance depending upon the contents of the respective files.

Referring now to the subroutine ROM as indicated in block 278, the program determines whether the ROM connected to the CPU has an indentification of "1" (indicating that it is a calendar ROM). If the identification number does not indicate the presence of a calendar ROM, the program proceeds from block 282 via connector A to the MAIN 1 portion of the program of FIG. 7A.

If the ROM is a calendar ROM, the program compares the contents of File X1 (current time) with the contents of File X2 (ROM time). The first five words of ROM time indicate the next schedule change (whether a holiday, or the like). This comparison (the results of which are stored in File X3) is also made, as indicated in block 283, to insure that the current time of the CPU is not ahead of the time stored representative of the next holiday. When an equality is indicated in block 285, a schedule event associated with that particular calendar or ROM time is implemented.

Words 5-8 in File X2 indicate the hours and minutes at which a "pending event" is to be implemented according to the current schedule (for example, the time at which a Register Selection Circuit is to be engaged or disengaged). When an equality is reached with the part of ROM time, the contents of the pending event register (File X2, Word F) are transferred to File X0, Word F (for current event). When the current time equals ROM time, in hours and minutes, the current event as defined by the schedule is implemented, see block 286 of the flow chart. After the contents of the pending event register are transferred to File X0, the next event is read into the pending event register, File X2, Word F; and its associated implementation time is transferred into the hours and minutes locations of ROM time (Words 5-8).

Referring to the flow chart, the ROM data and flags are processed in block 283 (that is, the comparison of time and transfer of data), and in block 286, the current event is implemented on the quarter hour. The function of decision block 285 is to determine that the system has not found the proper event for the current time in searching through the ROM schedule. In this case, the program loops back to MAIN 1. This happens, for example, when time is first set, and the system has to recycle through the ROM to identify an event associated with current time stored in the ROM.

The particular processor being used is characterized in that when power is first applied (either after a power outage or when a ROM or PROM is first installed), it proceeds to a predetermined address for the first instruction. That address and the first few thereafter contain an initialization routine which is not entered unless power is re-applied thereafter. This routine, briefly, clears out all of RAM, including setting the month to zero. The resultant fact that the month is set to zero (not ordinarily possible) is used in two places. The first one is in connection with block 226 (FIG. 7A) to determine whether or not to load the contents of the year to "70"; and the second is in connection with block 281A of FIG. 7B. If the month has been set to zero indicating that power has been re-applied and that the meter has not been reset, the program loops via connector A back to MAIN 1, block 205. This bypasses the energizing of the solenoids in block 286.

If, in block 282A, the month is not set to zero, normal operation is continued. This procedure prevents faulty operation (that is implementing functions not scheduled) for a period of at least thirty days. If the meter is attended to by an operator, he will normally set the month, and assuming that power is still applied, the normally scheduled functions will be implemented.

Re-Initialization

There are some circumstances in which it is desired that the CPU re-initialize itself relative to the ROM schedule. Such circumstances can arise, for example, when time is set in the CPU RAM, or when an AUTO-LOAD ROM is removed, and a new Calendar ROM inserted. This also occurs every night at midnight when the clock "rolls over".

To accomplish re-initialization or synchronization between the CPU (real time) and ROM schedule (calendar time), the schedule events are stored in sequential addresses in ROM in chronological order so that when the address counter is incremented, the next-occurring schedule event is read from the ROM, and the time at which the event occurs is transferred to words 0-8 of File X2 of FIG. 6—namely, the Random Access Memory in the Central Processor Unit. As indicated above, whenever the current time in File X1 equals the ROM time in File X2, the ROM time is incremented to the next schedule event.

One of the comparisons that is made in block 283 of the flow chart during each cycle of program operation is a comparison between Current Time (File X1) and ROM time (File X2) in the CPU. Whenever current time is equal to or greater than ROM time, the schedule event pointer (Words C, D in File X2) is incremented. By incrementing the word, the address is incremented to thereby call the next schedule event or holiday in ROM, in sequential order. This loads ROM time with the next sequential event time so that a new comparison may be made. If, as indicated in decision block 285, the current time has not caught up with real time, the program loops back through connector A for a new cycle until the incrementation eventually proceeds to the point where ROM time is greater than current time, and the system will then have been re-initialized.

When a ROM is removed, the program determines in block 212 that no ROM is present and follows path 212A. In block 214, as discussed above, ROM time is set to 0, thereby forcing a re-initialization. When a new ROM is inserted, the program proceeds through block 217 to path 218, but ROM time will have been set to 0 in File X2.

Re-initialization occurs when time is set because a depression of switch S2 sets ROM time in File X2 to all 0's.

When, at midnight, the clock rolls over, ROM time in file X2 is also set to all 0's, thereby causing the system to go into a re-initialization mode.

Referring back to block 232, when a synchronization pulse is identified by the CPU—namely one of those signals from the line frequency timing source 56 transmitted through the multiplexer unit 50 to input R8 of the CPU, the CPU will not accept another interrupt for a predetermined minimum period of time because it enters the MAIN 2 portion of the program, and must complete that portion before it re-enters MAIN 1. There are, in the execution of this portion of the program, delays of 0.1 seconds in block 259, 0.3 seconds in block 272, and 0.1 seconds in block 209. In addition to any other delays that may be incurred, for example, in executing instructions, there is a minimum time of 0.5 seconds before a new timing pulse interrupt will be recognized by the CPU. This comprises a minimum "refractory" time during which the system will not respond to an external timing pulse. Thus, the system acts as a digital filter in that it will not respond to a repetition rate faster than that defined by the refractory time.

If multiple events or functions are to be implemented simultaneously, it is handled two ways. If a multiple event is part of a daily schedule; e.g. turning on both the A register and the B register at 10:00 a.m., this fact is stored in the daily schedule in one event word, with a bit reserved for each register. A daily event word consists of twelve bits with eight bits containing the time and four bits storing the event(s); the second way a multiple event is handled concerns the holiday portion of the calendar ROM. This portion of the ROM also stores Leap Year, season start-and-stop dates and Daylight Saving Time start-and-stop dates. Each event in this portion is twelve bits with 372 of the 4,096 possible bit combinations reseved for holidays, 372 reserved for seasonal changes, 372 reserved for Daylight Saving Time changes and 400 reserved for designating Leap and non-Leap Years. Each event has a month and day associated with it and multiple, simultaneous events will simply have the same date. Internal flags in RAM record these events.

Only half of the calendar ROM is used: four bits of the available eight bits at each address. Three sequential four bit ½ words make up one calendar ROM event. A daily schedule event uses two bits to indicate which of four quarter hours the event is scheduled, four bits to indicate the units of hours and two bits to indicate the tens of hours. The remaining four bits are reserved to indicate the status of up to four discrete functions to be performed at the associated time.

Lists I and II comprise an instruction code list for the microprocessor identified above.

We claim:

1. In a system for controllably switching a load to and from a source of electrical power according to a predetermined time schedule, the combination comprising: timing means for generating periodic timing signals; programmable data processor means including at least first and second signal storage files, and responsive to said timing signals for generating real time clock data stored in said first file; readable memory means for storing data representative of a plurality of calendar times for effecting schedule events; said data processor means addressing said memory means and being programmed to retrieve said calendar time data stored at a location of said memory means addressed by said data processor means and store the data read-out in said second file; said data processor means being further programmed to compare said real time clock data in said first file with said calendar time data in said second file, and, if the real time represented by the real time data exceeds the calendar time represented by the calendar time data, to cyclically increment the calendar time read-out by incrementing addresses of said memory means until the calendar time represented by the calendar time data read out of said memory means and stored in said second file is greater than the real time represented by the real time data stored in said first file.

2. The apparatus of claim 1 wherein said first and second files comprise real time and calendar time files respectively, said apparatus further comprising external means for setting the contents of real time file, said data processor means being responsive to the setting of said real time file for resetting the contents of said calendar time file to contain data representative of a future event.

3. In a system for controllably switching a load to and from a source of electrical power according to a predetermined time schedule, the combination comprising: timing means for generating periodic timing signals; programmable data processor means including at least a real time signal storage file and a calendar time signal storage file, said data processor means being responsive to said timing signals for generating real time clock data stored in said real time file; readable memory means for storing data representative of a plurality of calendar times for effecting schedule events; said data processor means addressing said memory means and being programmed to retrieve said calendar time data therefrom and store the same in said calendar time file; said data processor means being further programmed to compare said real time clock data in said real time file with said calendar time data in said calendar time file for effecting a schedule event, and said data processor means being programmed to reset said calendar time file to zero when the contents of said real time file reaches a predetermined time, and to then cyclically increment said calendar times by incrementing addresses of said memory means until calendar time data in said calendar time file is greater than real time data stored in said real time file, thereby reinitializing the system.

4. In a system for controllably switching a load to and from a source of electrical power according to a predetermined time schedule, the combination comprising: timing means for generating periodic timing signals; programmable data processor means including at least a real time signal storage file, and a calendar time signal storage file, said data processor means being responsive to said timing signals for generating real time clock data stored in said first file; readable memory means for storing data representative of a plurality of calendar times for effecting schedule events; said data processor means addressing said memory means and being programmed to retrieve said calendar time data therefrom and store the same in said second file; said data processor means being further programmed to compare said real time clock data in said first file with said calendar time data in said second file, and to cyclically increment said calendar times by incrementing addresses of said memory means until calendar time data in said second file is greater than real time data stored in said first file, and said data processor means being responsive to the disconnecting of said memory means for communication with said data processor means for resetting the contents of said calendar time file to zero when said memory means is disconnected therefrom and thereby cause said data processor to re-initialize itself with said memory means by loading the data into said second file representative of the next schedule event.

5. Apparatus for applying predetermined switching schedules in a load control system for controllably switching a load to and from a source of electrical power, the combination comprising: a source of timing signals; programmable data processor means responsive to said source of timing signals for generating real time clock data and storing the same in a first file; memory means for storing calendar data representative of calendar times for effecting schedule events and event data associated with said calendar data, said calendar data including at least first and second dates defining seasonal changes for a given year, and at least first and second switching schedules to be applied, said data processor being in communication with said memory means and programmed to retrieve calendar data therefrom for comparing said calendar data with said real time data and for effecting said schedule events in accordance with said event data when real time equals the next-occurring calendar time, and for sequencing said calendar time data when a schedule event has been effected.

6. The apparatus of claim 5 further comprising display means for visually displaying data; display driver circuit means responsive to outputs from said data processor means for selectively energizing said display means to display data from said data processor means; display selection switch means; display set switch means; said data processor means being programmed to cyclically sense the state of said selection switch means and said set switch means for transmitting data to said display driver circuit means, the data transmitted to said display driver circuit means comprising time words representative of different portions of real time data in response to the sequential actuation of said display selection switch means, said data processor means being further responsive to the actuation of said display set switch means for incrementing the contents of a time word selected by said display selection switch means.

7. The apparatus of claim 6 further comprising multiplexer circuit means for selectively communicating said data processor means with said display selection switch means and said display set switch means, said source of timing signals comprising counter circuit means responsive to a line frequency timing signal for counting down the repetition rate of said line frequency timing signal to generate said timing signals, said multiplexer circuit means being responsive to the output of said counter circuit means for communicating said data processor means with said counter circuit means to extend said timing signals to said data processor means, said data processor means being responsive to said timing signals for generating said data in said first file, which comprises a real time data file, representative of real time.

8. The apparatus of claim 7 further comprising crystal oscillator means for generating a clock signal for said data processor means, said data processor means being responsive to the absence of said line frequency timing signal for using said clock signal of said crystal oscillator means to increment the contents of said real time data file.

9. In a system for controllably switching a load to and from a source of electrical power according to a predetermined time schedule, the combination comprising: programmable data processor means including timing source means for generating real time data and for storing the same in a real time file, and including a calendar time file; at least first and second interchangeable memory means, one of said memory means comprising calendar memory means for storing data representative of calendar times and associated schedule events, and the other memory means comprising a source of real time data for loading said real time file of said data processor means, each memory means having associated with it an identifying data signal, said data processor means being programmed to retrieve calendar times from one of said memories and storing the same in said calendar time file, and being further programmed to define said identifying data signals of said respective memory means and being responsive to the absence of an identifying data signal for resetting said calendar time file to zero, said data processor means being responsive to the data signal identifying a calendar memory means for comparing the contents of said real time file with the contents of said calendar time file from said calendar memory and for effecting said schedule event when said real time equals to said calendar time, and for then incrementing said calendar time to the next occurring calendar time.

10. The apparatus of claim 9 wherein said second memory means is removably associated with said data processor means, and upon connection of said second memory means to said data processor means, said data processor means is further responsive to the data signal identifying said second memory means for periodically transferring the contents of said calendar time file to said real time file, and for transferring real time data from said second memory means to said calendar time file, whereby when said second memory means is disconnected from said data processor means, the contents of said real time file will be representative of real time.

11. The apparatus of claim 10 wherein calendar time data and associated schedule event data are stored in locations of said calendar memory means in chronological order for sequential addresses, and said data processor means is further responsive to the absence of an identifying data signal to reset the contents of said calendar time file to zero, and is responsive to the identifying data provided when said calendar memory means is subsequently connected to said data processor means to compare the contents of said real time file with the contents of said calendar time file and sequentially increment the address of said calendar memory means until a location of said calendar file is reached which stores calendar data representing a time greater than the real time indicated by the contents of said real time file.

12. The apparatus of claim 11 further comprising an external source of timing signals derived from a line frequency voltage, said data processor means being responsive to said external source of timing signals for generating real time data in said real time file, said system further including a battery, and battery carryover circuit means for supplying power from said battery to said data processor means if said external source of power is removed, whereby said data processor circuit means may be set by said second memory means without an external power source and transported to an installation site, and said battery and battery carryover means will maintain power to said data processor circuit means for keeping real time current until an external source of power is applied.

13. In a system for controllably switching a load to and from a source of electrical power according to a predetermined time schedule, the combination comprising: external timing circuit means receiving line frequency voltage for generating a signal each cycle of line frequency; countdown circuit means responsive to said line frequency signal for generating digital output signal for each predetermined number of said line frequency signals; programmable data processor means responsive to the output signal of said countdown circuit means for generating real time data therefrom and for storing the same in a first file; memory means for storing data representative of calendar times for effecting schedule events and for storing associated event data; said data processor means being programmed to periodically compare said real time data with said calendar time data from said memory means for implementing said event data when real time equals the next scheduled calendar time, said program including predetermined delays comprising a substantial portion of a period of the output signals from said countdown counter circuit means during which said data processor means is not responsive to said external timing signals, whereby said system is rendered less sensitive to noise, on said line frequency signal.

14. The apparatus according to any one of claims 1, 5, 9, or 13 comprising an electric meter system for measuring the consumption of electric power, the system including at least first and second selectively engageable rate indicating registers, said system further comprising first and second register selection circuits associated respectively with said first and second registers and responsive to first and second outputs from said data processor means, said data processor means being responsive to said event data for selectively energizing said register selection circuits when indicated by the calendar time data retrieved being equal to the contents of said real time file and the event data associated therewith being representative of engaging one of said registers.

15. The apparatus of claim 14 wherein said data processor means includes a third output, said data processor means selectively energizing said third output at a preselected time as determined by a calendar word from said memory means and associated event data.

* * * * *

UNITED STATES PATENT AND TRADEMARK OFFICE
CERTIFICATE OF CORRECTION

PATENT NO. : 4,355,361

DATED : October 19, 1982

INVENTOR(S) : Richard L. Riggs et al

It is certified that error appears in the above-identified patent and that said Letters Patent are hereby corrected as shown below:

Column 3, line 18, delete "file" in the second occurnece.

Column 4, line 2, "toal" should read -- total --.

Column 5, line 40, "diaplay" should read -- display --.

Column 5, line 55, "15" should read -- 35 --

Column 9, line 8, "DISPLY" should read -- DISPLAY --.

Column 13, line 31, "eneters" should read -- enters --.

Column 14, line 12, "Registered" should read -- Register --.

Column 14, lines 15 and 16, "immiment" should read -- imminent --.

Column 15, line 35, "281A" should read -- 282A --.

In the Drawing Figures:

Fig. 7A, in block 236 "OSM" should read -- DSM --.

UNITED STATES PATENT AND TRADEMARK OFFICE
CERTIFICATE OF CORRECTION

PATENT NO. : 4,355,361

DATED : October 19, 1982

INVENTOR(S) : Richard L. Riggs et al

It is certified that error appears in the above—identified patent and that said Letters Patent are hereby corrected as shown below:

Claim 9, column 19, line 49, in the line beginning "to ..." delete "to".

Claim 12, column 20, line 20, insert -- circuit -- after "carryover".

Claim 12, column 20, line 21, delete "circuit".

Claim 13, column 20, line 44, delete "counter".

Signed and Sealed this

Fifteenth Day of February 1983

[SEAL]

Attest:

GERALD J. MOSSINGHOFF

Attesting Officer

Commissioner of Patents and Trademarks